United States Patent [19]

Ohuchi et al.

[11] Patent Number: 4,635,356
[45] Date of Patent: Jan. 13, 1987

[54] METHOD OF MANUFACTURING A CIRCUIT MODULE

[75] Inventors: Masayuki Ohuchi, Tokyo; Hirosi Oodaira, Chigasaki; Kenichi Yoshida, Tokyo, all of Japan

[73] Assignee: Kabushiki Kaisha Toshiba, Kawasaki, Japan

[21] Appl. No.: 765,800

[22] Filed: Aug. 15, 1985

[30] Foreign Application Priority Data

Dec. 28, 1984 [JP] Japan .................................. 59-274647
Mar. 26, 1985 [JP] Japan .................................. 60-61489

[51] Int. Cl.⁴ .............................................. H05K 3/30
[52] U.S. Cl. ........................................ 29/841; 29/589; 357/80
[58] Field of Search ................. 29/827, 841, 577, 588, 29/832, 839, 589; 156/344, 249; 174/68.5; 264/23; 357/80

[56] References Cited

U.S. PATENT DOCUMENTS

| | | | |
|---|---|---|---|
| 3,430,338 | 3/1969 | Flaherty | 29/839 |
| 3,570,715 | 3/1971 | Barnes | 29/827 X |
| 3,704,515 | 12/1972 | Nelson | 156/249 X |
| 3,905,376 | 9/1975 | Johnson et al. | 264/23 X |
| 3,992,236 | 11/1976 | Wanesky | 156/344 X |

FOREIGN PATENT DOCUMENTS 52-36985 3/1977 Japan .
54-140970 11/1979 Japan .

Primary Examiner—Howard N. Goldberg
Assistant Examiner—Carl J. Arbes
Attorney, Agent, or Firm—Oblon, Fisher, Spivak, McClelland, & Maier

[57] ABSTRACT

Terminal-equipped electronic elements, such as chip resistors and chip diodes, are arranged such that one surface of each terminal contacts one surface of a support board, the support board being placed to face a flat plate through a spacer. An electrically insulative liquid synthetic resin is injected between the support board and the flat board and cured to form a synthetic resin layer burying the electronic elements. The support board, flat board and spacer are peeled from the electronic elements and the synthetic resin layer to expose one surface of the terminal of each electronic element on one surface of the synthetic resin layer. A conductive pattern is formed on the synthetic resin layer by screen printing to connect the terminals of the electronic elements.

17 Claims, 14 Drawing Figures

METHOD OF MANUFACTURING A CIRCUIT MODULE

BACKGROUND OF THE INVENTION

This invention relates to a method of manufacturing a circuit module that uses synthetic resin.

In the prior art method of manufacturing a circuit module, a copper foil formed on the resin substrate is selectively etched to form the circuit pattern of the printed circuit board to which electronic elements such as ICs and capacitors are soldered or connected by conductive bonding. With this method it is possible to use a wiring board in which a circuit pattern is formed on a substrate made of a ceramic such as alumina by means of thick film printing, instead of a printed circuit board.

The thickness of a circuit module obtained in this way is the total of the thickness of the substrate and the thickness of electronic elements, and, accordingly, the thickness that results when this method of manufacture is used is too great for electronic devices requiring ever decreasing size. Also, with this method of manufacture the process of manufacturing the printed circuit board and the process of mounting the electronic elements on the board are performed independently, complicating the manufacturing process, and increasing the time and cost.

SUMMARY OF THE INVENTION

The object of the invention is to provide a method of manufacturing a circuit module in which it is possible to decrease the thickness of the circuit module such that it is substantially even with the electronic elements, and wherein the conductive pattern formation of the circuit module and its connection with the electronic elements can be performed in the same simplified process, thereby decreasing the manufacturing cost.

In the method of manufacturing a circuit module according to this invention, a plurality of electronic elements, each having a terminal, are placed on prescribed locations on one surface of a support board, with one surface of each terminal being adjoined to the surface of the support board. The surface of the support board is faced against a flat surface of a substrate at a regular interval. An insulative synthetic resin is injected onto the surface of the support board to bury the electronic elements. The synthetic resin hardens to form a synthetic resin layer, in which electronic elements are buried, such that one surface of the resin contacts one surface of the support board and the other surface of the resin contacts the surface of the substrate. The support board is then peeled from the electronic elements and the synthetic resin layer to expose the surface of the terminal of each electronic element on one surface of the synthetic resin layer. The terminals of the elements are then, finally, electrically connected.

With this method of manufacturing a circuit module, two groups, each having a plurality of terminal-equipped electronic elements, are placed at specified locations such that one surface of each terminal of one of the groups and that of each terminal of the other group are in contact with one surface of a first support board and that of a second support board, respectively. The surface of the first support board and the surface of the second support board face one another, separated by a specified interval. An electrically insulative synthetic resin is injected between the first and second support boards to cover the electronic elements. The resin then hardens, fixing the elements in their specified locations, to form a synthetic resin layer in which the electronic elements are buried. The first and second support boards are peeled from the electronic elements and the synthetic resin layer, one surface of each terminal of each element on each side of the synthetic resin layer is exposed, and the terminals are electrically connected.

With this method of manufacturing a circuit module, a plurality of terminal-equipped electronic elements are positioned at specific locations such that support boards are formed into pairs, with one surface of one support board of the pair facing one surface of the other support board of the pair at a specified interval. An electrically insulative synthetic resin is injected between the support boards to cover the electronic elements. The resin hardens, forming a synthetic resin layer with the electronic elements buried inside and fixed at specified locations. Then, the support boards are peeled from the electronic elements and the synthetic resin layer so that one surface of each terminal of each element on each side of the synthetic resin layer is exposed. The terminals are then electrically connected. The synthetic resin layers are placed at specified intervals and a synthetic resin is injected into each interval. The terminals of the electronic elements in the plurality of synthetic layers are then electrically connected.

BRIEF DESCRIPTION OF THE DRAWINGS

This invention can be better understood with reference to the drawings in which;

FIGS. 1 to 5 show the steps of manufacturing a circuit module of one embodiment of this invention, wherein:

FIG. 1 is a plan view of a support board on which electronic elements are mounted, FIG. 2 is a cross section along line II—II of FIG. 1, FIG. 3 is a cross section showing a synthetic resin injected between the support board and a flat board, FIG. 4 is a cross section showing the cured synthetic resin layer from which the support board and the flat board are peeled, and FIG. 5 is a cross section of a circuit module showing a conductive pattern formed on the surface of the synthetic resin layer of FIG. 4, FIG. 7 is a cross section of a support board on which electronic elements are mounted, FIG. 8 is a cross section showing a synthetic resin injected between a first support board and a second support board, FIG. 9 is a cross section showing the cured synthetic resin layer from which the first and second boards are peeled, FIG. 10 is a cross section of the circuit module showing a conductive pattern formed on the surface of the synthetic resin layer of FIG. 9, and FIG. 11 shows one arrangement in which the circuit modules shown in FIG. 10 are stacked, one over the other, FIG. 12 is a perspective view of a chip resistor and a chip capacitor, FIG. 13 is a plan view of a chip transistor, and FIG. 14 is a side view of the chip transistor.

DETAILED DESCRIPTION OF THE PREFERRED EMBODIMENTS

Figure 1:
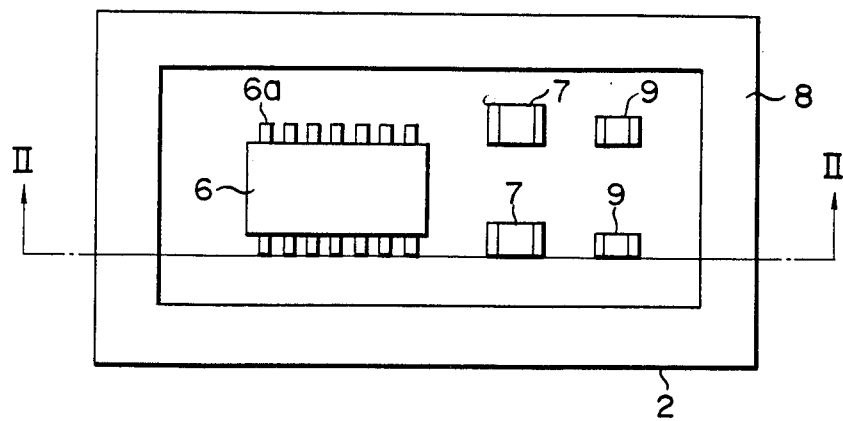
Figure 2:
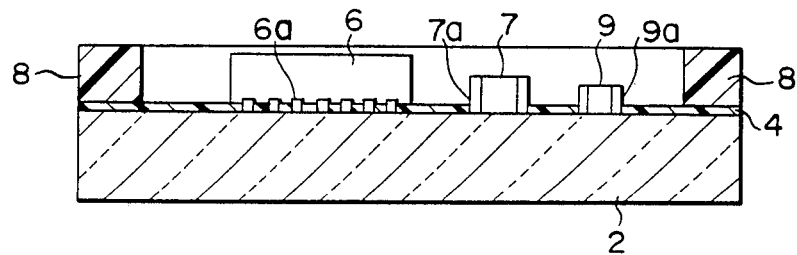
Figure 3:
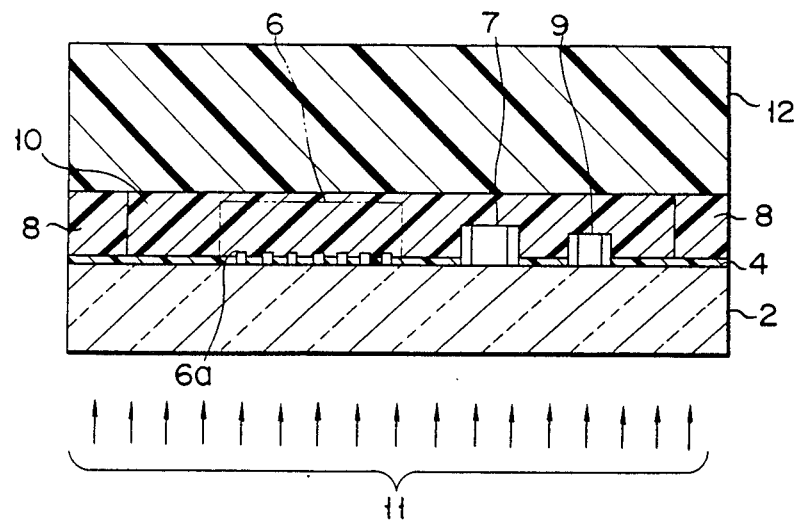

The following description of the method of manufacturing a circuit module of one embodiment of this invention will be given with reference to FIGS. 1 to 5. Support board 2, which is formed of a 3 mm thick glass plate having a flat, smooth top, has a silicon resin film 4 (TSE 3051, Toshiba Silicon), 10 μm thick, formed on its top surface by spin coating. Film 4 is heated at 120° C. for 15 min. to gel it so that electronic elements can be temporarily affixed to support board 2. Specifically, it is heated to give it an adhesive quality. As shown in FIGS. 1 and 2, electronic elements such as integrated circuit 6, chip diodes 7 and chip resistors 9 are positioned at specified locations on gelled film 4, coated on support board 2, using a chip mounter, such that terminals 6a, 7a, 9a are in contact with support board 2. Next, a Teflon spacer 8, having a height of 2 mm, is positioned on support board 2 to surround integrated circuit 6, chip diodes 7 and chip resistors 9 on the upper surface of support board 2. The height of spacer 8 is the same or slightly higher than the highest electronic element, in this case, integrated circuit 6. As shown in FIG. 3, an insulative ultraviolet curing resin 10 is injected over the electronic elements surrounded by spacer 8, to a level even with the top of spacer 8. Teflon flat board 12, 5 mm thick, for example, and with a smooth, flat bottom surface, is placed on the top surface of spacer 8 in contact with the filling resin 10, the flat board 12 forming a substrate. Ultraviolet rays 11 (represented by arrows in FIG. 3) are radiated into resin 10 through UV-transparent support board 2 to obtain a cured synthetic resin layer. Next, support board 2, flat board 12 and spacer 8 are peeled from the cured synthetic resin layer.

Figure 4:
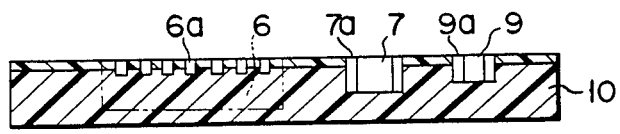

As a result, integrated circuit 6, chip diodes 7 and chip resistors 9 are buried inside the resin layer, as is shown in FIG. 4, while terminals 6a, 7a and 9a are exposed on the upper surface of the resin layer. Resin 10 has the function of a printed circuit board in the prior art circuit modules.

Figure 5:
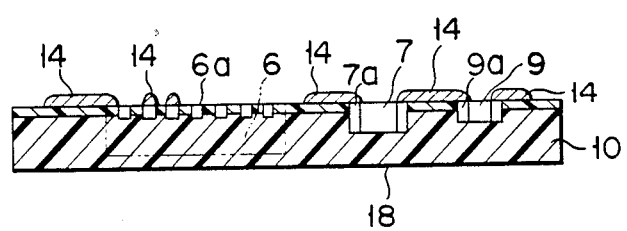

As shown in FIG. 5, a silver paste, for example, is printed onto the upper surface of resin 10 by screen printing. The desired conductive pattern 14 is formed thereby, and terminals 6a, 7a and 9a are electrically connected. Lastly, the resin layer is heated for one hour at 150° C. to cure the silver paste and complete the circuit module 18

In this manufacturing method, flat board 12 is arranged on spacer 8 after liquid synthetic resin 10 is injected into the space surrounded by spacer 8. It is, however, possible to inject liquid synthetic resin 10 after flat board 12 has been placed on the upper surface of spacer 8.

Figure 6:
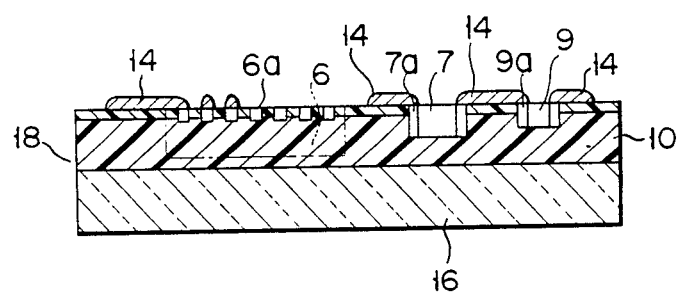
FIG. 6 is a cross section of a circuit module showing a variation of the method of manufacturing according to this invention.

The following is a description, with reference to FIG. 6, of a variation of the above method of manufacturing a circuit module. In this variation, in order to reinforce circuit module 18, a 2 mm thick glass epoxy flat board 16 is arranged on the upper surface of resin 10, instead of flat board 12. This flat board 16 is not peeled off, but rather, is left on resin 10.

Figure 7:
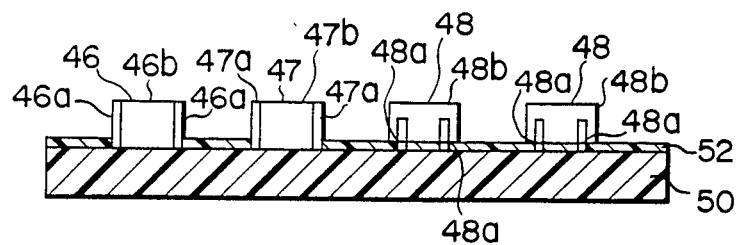
FIGS. 7 to 11 are presented to explain the steps of manufacturing a circuit module of another embodiment of this invention.
Figure 8:
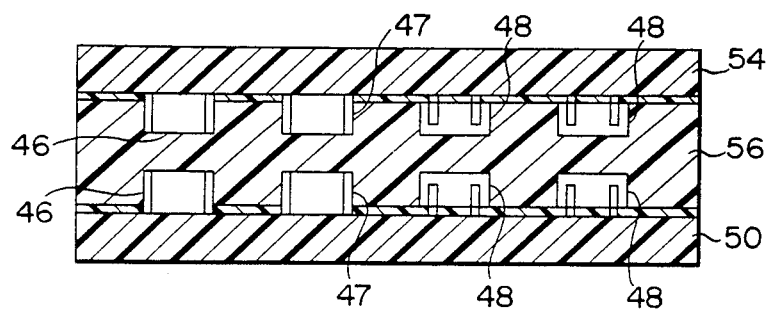
Figure 12:
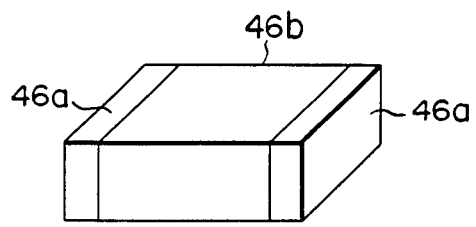
FIGS. 12 to 14 show electronic elements used in the embodiments of this invention.
Figure 13:
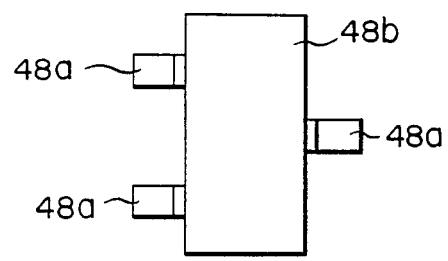
Figure 14:
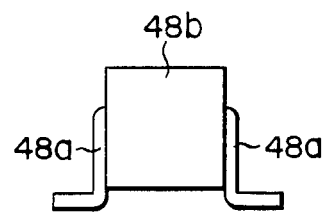

The following is a description, with reference to FIGS. 7–11, of a method of manufacturing a circuit module according to another embodiment of this invention. As shown in FIG. 7, an vinyl acetate-ethylene copolymer film 52 is formed on a 100 μm thick Mylar film (trademark of Dupont), it being the first support board 50, to a thickness of 20 μm. Electronic elements such as chip resistor 46, chip capacitor 47 and 2 chip transistors 48 are positioned at prescribed locations on the upper surface of first support board 50 through film 52 which acquires adhesion by a slight heat. Terminals 46a, 47a, 48a of the elements are in contact with the upper surface of first support board 50. As shown in FIG. 12, chip resistor 46 has a rectangular parallelepiped element 46b with terminals 46a on opposite sides. As shown in FIGS. 13 and 14, chip transistor 48 has an element 48b and terminals 48a, each terminal 48a extending from each side to the bottom. Chip capacitor 47 has the same shape as chip resistor 46.

Figure 9:
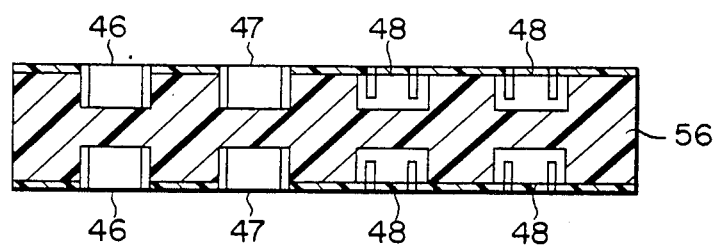

First support board 50 is placed to face a second support board 54 which has the same structure as first support board 50. A thermosetting resin, liquid epoxy resin 56 (100 parts by weight of Araldite AW1-06—available from Nippon Chiba Gaigi-mixed with 100 parts by weight of a hardner HV953U, also available from Nippon Chiba Gaigi), is heated and injected between first and second support boards 50 and 54. Resin 56 is heated at 40° C., for three hours for curing, to form a synthetic resin layer. As shown in FIG. 9, after the resin layer is cooled, first and second support boards 50 and 54 are peeled from the resin layer.

Figure 10:
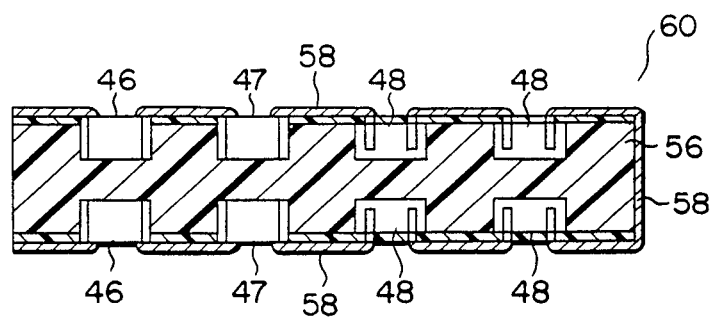

In FIG. 10, after chemical abrasion of the resin layer with dilute hydrochloric acid, the silver paste applied (Conductor Paste #6838, Dupont) between terminals 46a of chip resistors 46, terminals 47a of chip capacitors 47 and terminals 48a of the chip transistors 48 is printed to form conductive patterns 58 by screen printing. After the conductive pattern 58 has been dried, it is heated at 150° C. for three hours for curing. A solder resist (Solder Resist 150B, Taiyo Inki), which is cured by ultraviolet rays, is printed onto the surface of the resin layer and cured, resulting in a first circuit module 60.

Figure 11:
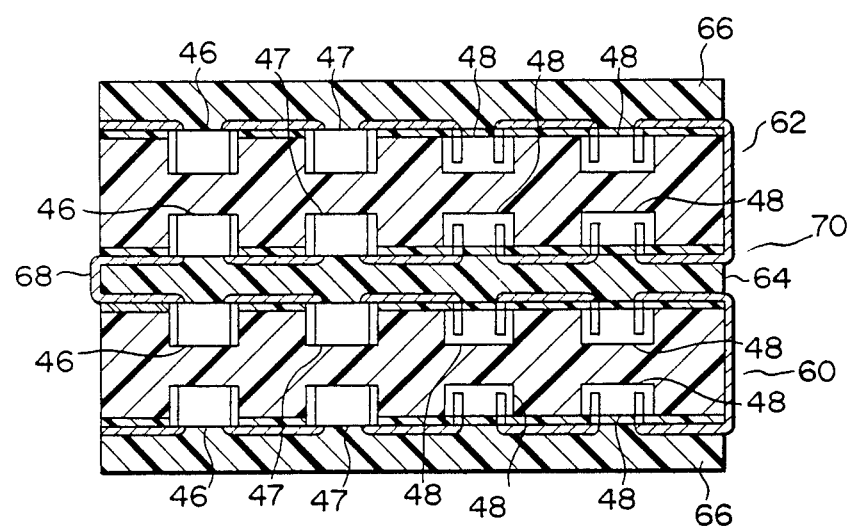

As shown in FIG. 11, a second circuit module 62, formed in the same manner as first circuit module 60, is faced against first circuit module 60. An epoxy resin 64 is injected between first and second circuit modules 60, 62. Epoxy resin 64 is then cured to form a laminate structure of two circuit modules 60, 62. Each insulative resin layer 66 is provided for protection on both sides of this laminate structure, which is then cut to the desired dimensions. Conductive pattern 68 is formed on the laminate structure, and serves to connect first and second circuit modules 60 and 62. As a result, a circuit module 70 is obtained.

By providing two chip resistors, one chip capacitor and two chip transistors for each of the two modules, an astable multivibrator is constructed. In test operations of the multivibrator the output between the collector and emitter of the transistors of the multivibrator was observed, and the stability of the circuit determined.

In the prior art, when two printed circuit boards are connected, connectors are used, resulting in an increase in the space required by the circuit module. According to another embodiment of this invention, however, these circuits can be stacked and connected without the connectors, also serving to reduce the space required. Additionally, with the other embodiment, it is possible to stack three or more circuit modules.

Instead of using a glass plate as the support board, it is possible to use polyethylene terephthalate resin, polycarbonate resin, vinyl chloride resin, polyethylene resin, poly(tetrafluoroethylenehexafluoropropylene) resin, polystyrene resin or polysulfone resin. Instead of using a Teflon sheet for flat board 12, it is possible to use a Teflon or silicon resin coated synthetic resin board.

In place of flat board 16, used in the variation, it is possible to use a board made of glass reinforced epoxy, butylene terephthalate resin, polyethersulfone resin, polyetheretherketone resin, polycarbonate resin, polysulfone resin, polyphenylene sulphide resin, or polyphenylene oxide resin.

Although in the second embodiment some spacers are left unused, it is possible to use these spacers if so desired.

The film mentioned above may be heat treated polyethylene, and the support board may be made of metal. The injected resin may be diallyl phthalate resin, unsaturated polyester, polybutadiene resin, silicone, or urethane resin. The conductive pattern may be formed by vapour deposition or photographic etching, or a direct pattern may be formed using a nonelectrolytic plating method.

In the second embodiment, a hole may be formed through the stacked circuit modules and filled with a conductive material to connect the individual circuit module. A metal wire may be buried in the resin for the same purpose.

This invention is not limited to the above, and various different materials and shapes may be employed without departing from the scope of the invention.

What is claimed is:

1. A method of manufacturing a circuit module comprising:
   a first step of placing a plurality of terminal-equipped electronic elements at prescribed locations on one surface of a support board such that one surface of each terminal is in contact with the surface of said support board;
   a second step of placing the surface of said support board such that it faces a flat surface of a substrate at a prescribed interval, and of injecting an electrically insulative synthetic resin into the interval so that it flows onto the surface of said support board to bury said electronic elements;
   a third step of curing said synthetic resin to form a synthetic resin layer, burying said electronic elements, such that one surface of the resin layer contacts the surface of said support board, and the other surface of the resin layer contacts the flat surface of said substrate;
   a fourth step of peeling said support board from said electronic elements and said synthetic resin layer to expose the surface of each terminal of each electronic element on the surface of said synthetic resin layer; and
   a fifth step of electrically connecting the terminals of said electronic elements.

2. A method of manufacturing a circuit module according to claim 1, wherein said first step includes preforming an adhesive film on one surface of said support board, inserting parts of electronic elements into the film from the terminal side and temporarily fixing said electronic elements by means of the adhesive film.

3. A method of manufacturing a circuit module according to claim 2, wherein said film is formed by softening silicone, vinyl acetate-ethylene copolymer or polyethylene.

4. A method of manufacturing a circuit module according to claim 1, wherein said second step includes arranging a spacer, which encompasses said electronic elements, on one surface of said support board, and placing said substrate on the surface of said spacer, such that said support board and said substrate face each other at a prescribed interval.

5. A method of manufacturing a circuit module according to claim 1, wherein said support board is formed of glass which, being transparent, admits ultraviolet rays, said synthetic resin being cured by ultraviolet rays radiated from the other side of said support board onto said synthetic resin in said third step, in order to cure said synthetic resin.

6. A method of manufacturing a circuit module according to claim 1, wherein said fifth step includes forming a conductive pattern on one surface of said synthetic resin layer by screen printing.

7. A method of manufacturing a circuit module according to claim 1, wherein said fifth step includes forming a conductive pattern on one surface of said synthetic resin layer by offset printing.

8. A method of manufacturing a circuit module according to claim 1, wherein said fifth step includes forming a conductive pattern on one surface of said synthetic resin layer by vapour deposition.

9. A method of manufacturing a circuit module according to claim 1, wherein said fifth step includes forming a conductive pattern on one surface of said synthetic resin layer by photo-etching.

10. A method of manufacturing a circuit module according to claim 1, wherein said fifth step includes forming a conductive pattern on one surface of said synthetic resin layer by nonelectrolytic plating.

11. A method of manufacturing a circuit module according to claim 1, wherein said synthetic resin is a thermosetting resin and said third step includes heating said resin to a prescribed temperature.

12. A method of manufacturing a circuit module according to claim 11, wherein said thermosetting resin is formed of epoxy, unsaturated polyester, diallyl phthalate resin, polybutadiene resin or urethane resin.

13. A method of manufacturing a circuit module according to claim 1, which further comprises a sixth step of peeling said substrate from said synthetic resin layer.

14. A method of manufacturing a circuit module comprising:
   a first step of positioning two groups, each having a plurality of terminal-equipped electronic elements, at specified locations such that one surface of each terminal of one of the groups and that of each terminal of the other group are in contact with one surface of a first support board and that of a second support board, respectively;
   a second step of placing one surface of said first support board facing one surface of said second support board at a prescribed interval, and injecting an electrically insulative synthetic resin between the surface of said first support board and the surface of said second support board to bury said electronic elements inside said resin;
   a third step of curing said synthetic resin to form a synthetic resin layer burying said electronic elements such that said electronic elements are fixed at specified locations;

a fourth step of peeling said first and second support boards from said electronic elements and said synthetic resin layer to expose the surface of each terminal of each electronic element on each surface of said synthetic resin layer; and a fifth step of electrically connecting the terminals of said electronic elements buried in said synthetic resin layer.

15. A method of manufacturing a circuit module, comprising:

a first step of placing a plurality of terminal-equipped electronic elements at prescribed locations on each of a plurality of support boards such that one surface of each terminal is in contact with one surface of the support board;

a second step of forming said support boards into pairs, with one surface of one support board in one pair facing one surface of the other support board in said pair, and of injecting an electrically insulative synthetic resin between said support boards to bury said electronic elements;

a third step of curing said synthetic resin to form a synthetic resin layer burying said electronic elements such that said electronic elements are in fixed locations;

a fourth step of peeling said support boards from said electronic elements and said synthetic resin layer to expose the surface of each terminal of each electronic element on both surfaces of each synthetic resin layer;

a fifth step of electrically connecting the terminals of said electronic elements;

a sixth step of facing each synthetic resin layer at specified intervals and injecting an electrically insulative synthetic resin between the synthetic resin layers;

a seventh step of curing said resin; and an eighth step of electrically connecting the terminals of the electronic elements of synthetic resin layers.

16. A method of manufacturing a circuit module according to claim 15, wherein said eighth step includes forming conductive patterns on both sides of each synthetic resin layer and connecting the terminals of said electronic elements of synthetic resin layers.

17. A method of manufacturing a circuit module according to claim 15, wherein said eighth step includes forming holes through said synthetic resin layers and filling in the holes with a conductive material to connect the terminals of said electronic elements of said synthetic resin layers.

* * * * *